(12) United States Patent
Jang

(10) Patent No.: US 6,990,027 B2
(45) Date of Patent: Jan. 24, 2006

(54) SEMICONDUCTOR MEMORY DEVICE HAVING ACCESS TIME CONTROL CIRCUIT

(75) Inventor: Chae Kyu Jang, Icheon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 66 days.

(21) Appl. No.: 10/876,107

(22) Filed: Jun. 24, 2004

(65) Prior Publication Data

US 2005/0128833 A1 Jun. 16, 2005

(30) Foreign Application Priority Data

Dec. 10, 2003 (KR) ............................. 10-2003-0089325

(51) Int. Cl.
*G11C 7/00* (2006.01)

(52) U.S. Cl. ............. 365/201; 365/189.08; 365/189.11; 365/194

(58) Field of Classification Search ................. 365/203, 365/222, 194, 201, 189.08, 225.7, 189.11
See application file for complete search history.

(56) References Cited

U.S. PATENT DOCUMENTS

| | | | | |
|---|---|---|---|---|
| 6,104,653 | A | * | 8/2000 | Proebsting ................... 365/203 |
| 6,212,109 | B1 | * | 4/2001 | Proebsting ................... 365/190 |
| 6,744,684 | B2 | * | 6/2004 | Arimoto et al. ............. 365/222 |
| 6,885,606 | B2 | * | 4/2005 | Kumazaki et al. ...... 365/230.03 |

* cited by examiner

*Primary Examiner*—Son T. Dinh
(74) *Attorney, Agent, or Firm*—Marshall, Gerstein & Borun

(57) ABSTRACT

Provided is directed to a semiconductor memory device including a control path for enabling a sense generator signal for delaying time as long as a bitline sense amplifier operates in response to a row active signal and enabling a precharge signal according to the sense generator signal, wherein the control path includes: a first time control unit for varying an enabling time of the sense generator signal by each time, according to a special test mode signal for testing the semiconductor memory device and a specific column address; and a second time control unit for varying an enabling time of the precharge signal by each step, according to a special test mode signal for testing the semiconductor memory device and a specific column address.

7 Claims, 8 Drawing Sheets

SEMICONDUCTOR MEMORY DEVICE HAVING ACCESS TIME CONTROL CIRCUIT

This application relies for priority upon Korean Patent Application No. 2003-0089325 filed on Dec. 10, 2003, the contents of which are herein incorporated by reference in their entirety.

BACKGROUND

1. Field of the Invention

The present invention relates to a semiconductor memory device, and more particularly to, a semiconductor memory device capable of controlling an address access time tAA.

2. Discussion of Related Art

In a semiconductor memory device such as a pseudo SRAM, speed of a sense generator signal sg, as a control signal of a bitline sense amplifier, and a precharge signal pcg is an important parameter determining an address access time tAA.

FIG. 1 is a schematic block diagram illustrating a row path of a semiconductor memory device.

An address inputted through an input buffer 10 is stored in a register 20, and a part of addresses is inputted in a state machine 30. The state machine 30 generates a code for controlling a chip select signal /CS, a precharge signal pcg, a sense generator signal sg, a column address strobe signal /CAS, and a row address strobe signal /RAS. A control path 50 activates a cell block 60 according to signals supplied from the register 20, the state machine 30, and a refresh control unit 40.

FIG. 2 is a waveform diagram illustrating a bitline sensing operation.

The sense generator signal sg maintains high level by the state machine 30, and then when the precharge signal pcg is enabled to high state, the sense generator signal sg becomes low state, which results in that a potential of a bitline becomes Vcore/2. When the sense generator signal sg rises to high state and the column address select signal Yi is enabled, a potential of a corresponding bitline BL rises to a core voltage Vcore, while a potential of a bitline /BL falls down to a ground potential VSS.

FIG. 3 is a block diagram illustrating a control path of a row path in the conventional art. It will be explained with reference to FIG. 4.

A chip is enabled in a period that the chip select signal /CS1 is low state and then starts to receive an address ADD. After a row active signal rowact is enabled, the sense generator signal sg is enabled. The sense generator signal. sg enables the precharge signal pcg. The sense generator signal sg determines an enabling timing of sense amplifier control signals, i.e., an rto (generally high voltage) and an sb (generally a ground voltage), as a signal for delaying a time as long as a bitline sense amplifier (now shown) operates after the row active signal rowact is enabled. The precharge signal pcg determines a disabling timing of the rto and the sb.

That is, when the sense generator signal sg is enabled after the row active signal rowact is enabled, the bitline sense amplifier is operated, which leads to output a developed data DO (as shown in FIG. 4). When the prechage signal pcg is enabled, the sense generator signal sg is disabled.

As aforementioned, the conventional control path has a default scheme for outputting data by 1) when the address ADD is enabled, the row active signal rowact is enabled, 2) the precharge signal pcg is enabled, 3) the previous (or existing) sense generator signal sg is disabled, and 4) the sense generator signal sg is enabled again. It will be performed the same operation as the aforementioned operation in a refresh mode. Data is outputted by those sequential operations. However, in the conventional art, there is no method for analyzing a time taken by data outputting after an address is inputted, namely, the address access time tAA, by each period.

SUMMARY OF THE INVENTION

The present invention is directed to provide a semiconductor memory device comprising an address access time control circuit, capable of improving a yield of a semiconductor device by means of analyzing the address access time by each time and a method of controlling an address access time.

One aspect of the present invention is to provide a semiconductor memory device having an address access time control circuit, including: a control path for enabling a sense generator signal for delaying time as long as a bitline sense amplifier operates in response to a row active signal and enabling a precharge signal according to the sense generator signal, wherein the control path includes: a first time control unit for varying an enabling time of the sense generator signal by each step, according to a special test mode signal for testing the semiconductor memory device and a predetermined column address; and a second time control unit for varying an enabling time of the precharge signal by each step, according to a special test mode signal for testing the semiconductor memory device and a predetermined column address.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Here, it will be described about embodiments of the present invention with reference to the accompanying drawings.

Figure 1:
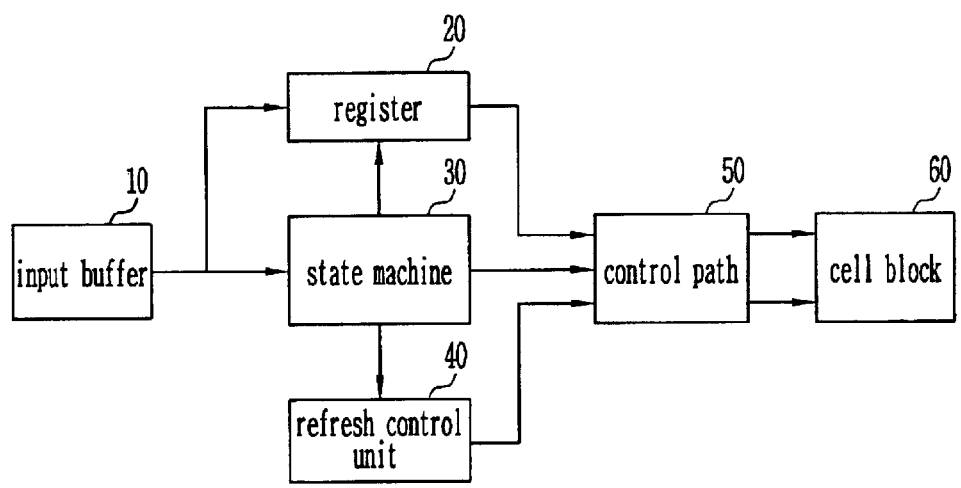
FIG. 1 is a schematic block diagram of a semiconductor memory device.
Figure 2:
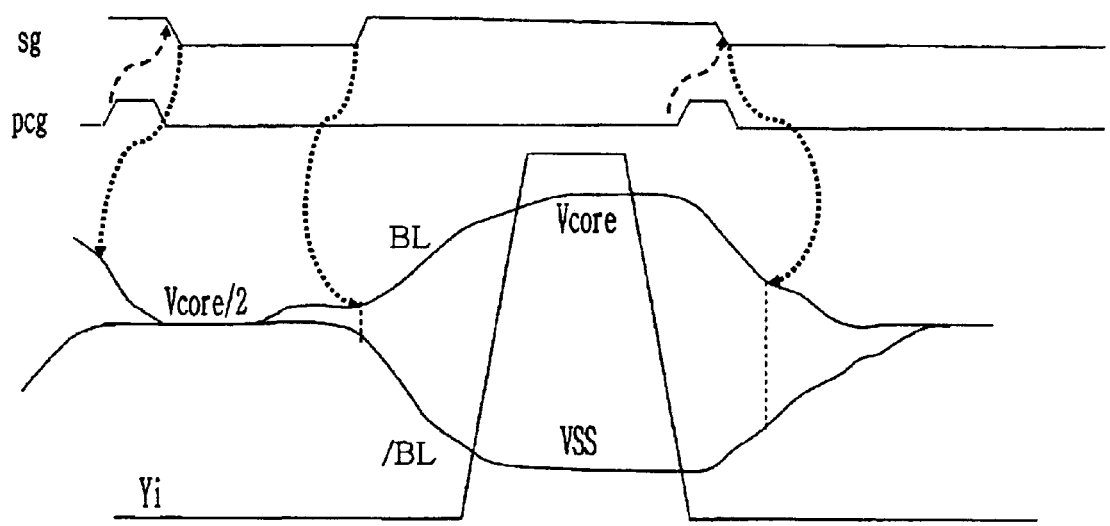
FIG. 2 is a waveform diagram illustrating a bitline sensing operation.
Figure 3:
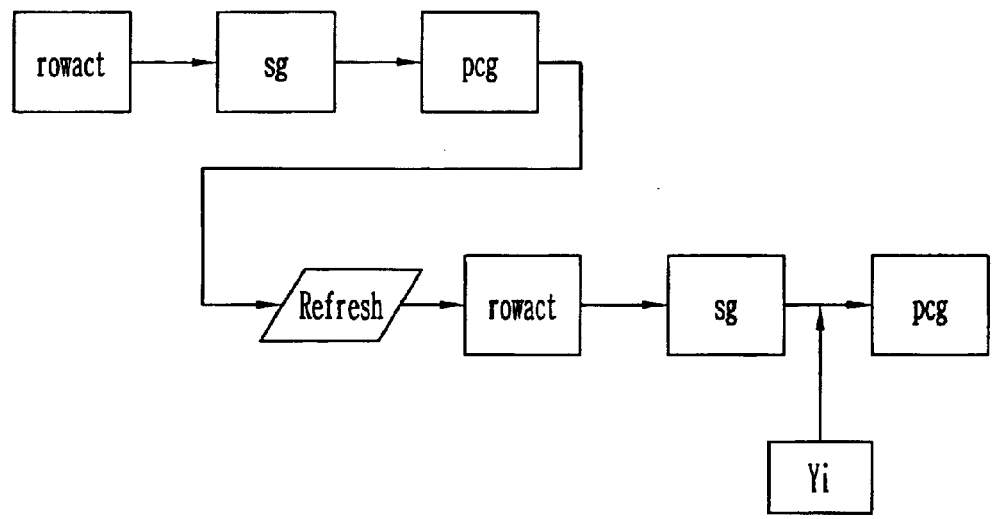
FIG. 3 is a block diagram illustrating a control path of a row path in the conventional art.
Figure 4:
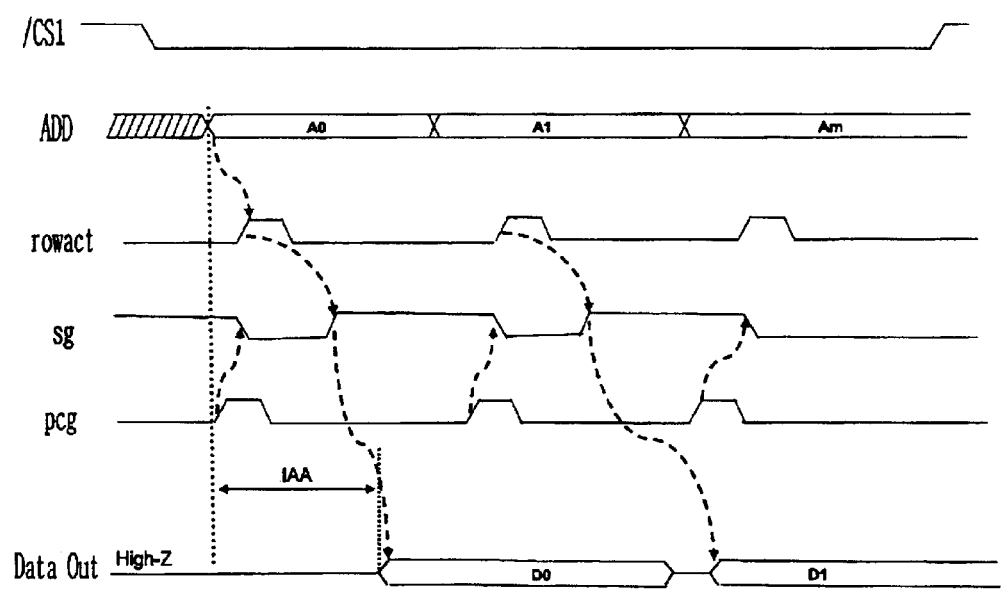
FIG. 4 is a timing diagram illustrating an operation of FIG. 3.
Figure 5:
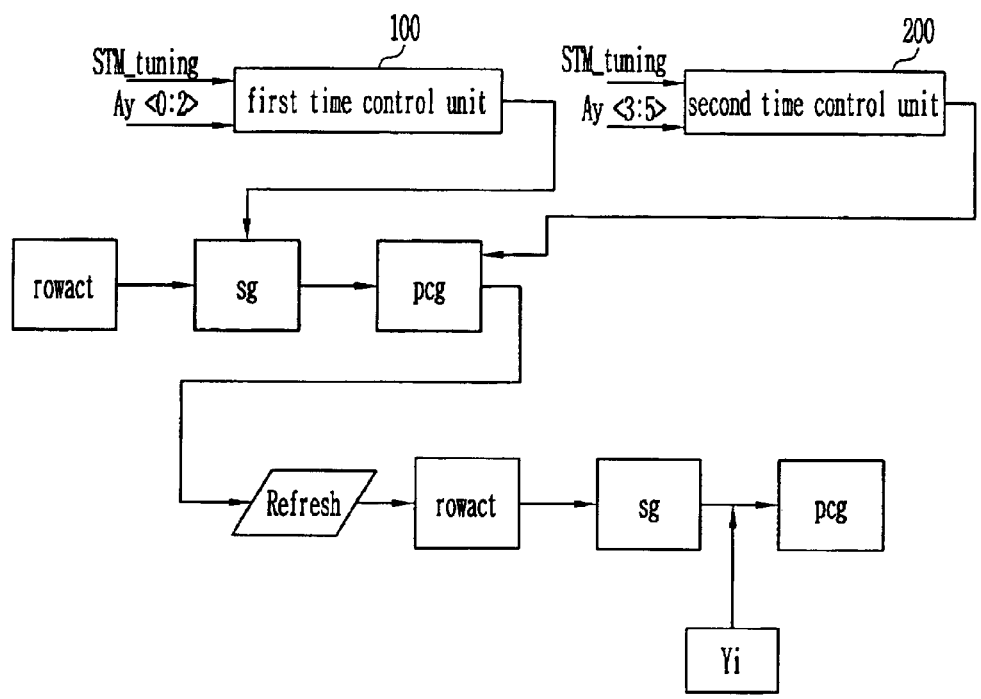
FIG. 5 is a block diagram illustrating a control path of a row path in accordance with the present invention.
Figure 6:
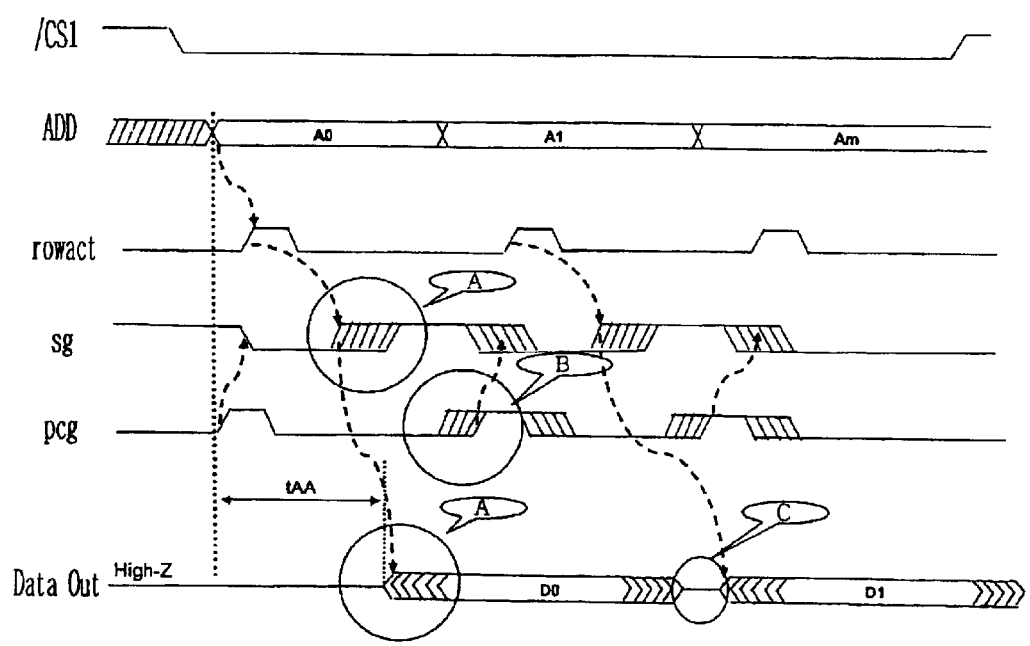
FIG. 6 is a timing diagram illustrating an operation of FIG. 5.

FIG. 5 is a block diagram illustrating a control path in accordance with the present invention and it will be described about its operation with reference to FIG. 6.

It is entered into a special test mode for testing the semiconductor memory device. Special test signals STM_tuning<2, 3, 4> and column addresses Ay<0:2> are applied to a first time control unit 100. The first time control unit 100, as denoted with "A" in FIG. 6, generates a code signal in order to enable the sense generator signal sg in advance according to the special test signals STM_tuning<2, 3, 4> and the column addresses Ay<0:2>, for instance, at an interval of 0.5. The code signal determines an enabling time of the sense generator signal sg. When the enabling time of the sense generator signal sg is faster, a data output Data out also gets as fast as that. That is, a window of the data DO is varied.

Moreover, the special test mode signals STM_tuning<2, 3, 4> and column addresses Ay<3:5> are applied to a second time control unit 200. The second time control unit 200, as denoted with "B" in FIG. 6, generates a code signal in order to enable the precharge signal pcg in advance in response to a special test mode signal STM_tuning and the column addresses Ay<3:5>, for instance, at an interval of 0.5. The code signal determines an enabling time of the precharge signal pcg. When the enabling time of the precharge signal pcg is faster, the disabling time of the sense generator signal sg gets as fast as that. That is, after the first data DO is outputted, an output time of a succeeding data D1 is varied.

As it is, if the data output is generated by varying the enabling time of the sense generator signal sg and the precharge signal pcg, it also advantageous to analyze the overall characteristics of the semiconductor memory device.

In the refresh mode, the sense generator signal sg and the precharge signal pcg are generated as same as in the conventional art. The first and second time control units have the same configuration but have a different signal input.

Figure 7:
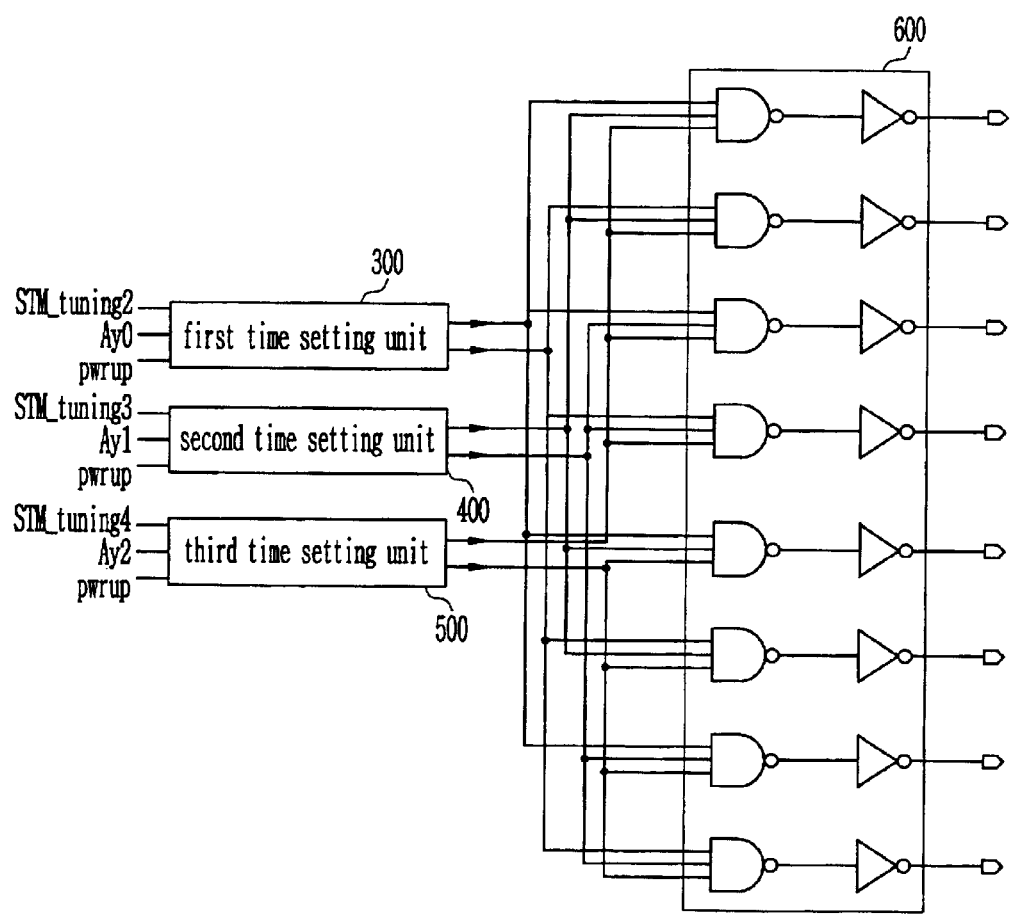
FIGS. 7 and 8 are detailed circuit diagrams illustrating a time control unit of FIG. 5.

FIG. 7 is a detailed circuit diagram of the first time control unit of FIG. 5.

A first time setting unit 300, for instance, receives the special test signal STM_tuning2, the column address Ay0, and a power-up signal pwrup. A second time setting unit 400, for instance, receives the special test signal STM_tuning3, the column address Ay1, and the power-up signal pwrup. A third time setting unit 500, for instance, receives the special test signal STM_tuning4, the column address signal Ay2, and the power-up signal pwrup.

Each time setting unit 300 to 500, for instance, generates a pair of high and low logic signals in response to an input signal. As a result, the generated 6 signals are decoded in a decoding circuit 600 and then 8 decode signals are generated.

A preamble time of the sense generator signal sg is determined according to the decoded signals.

Figure 8:
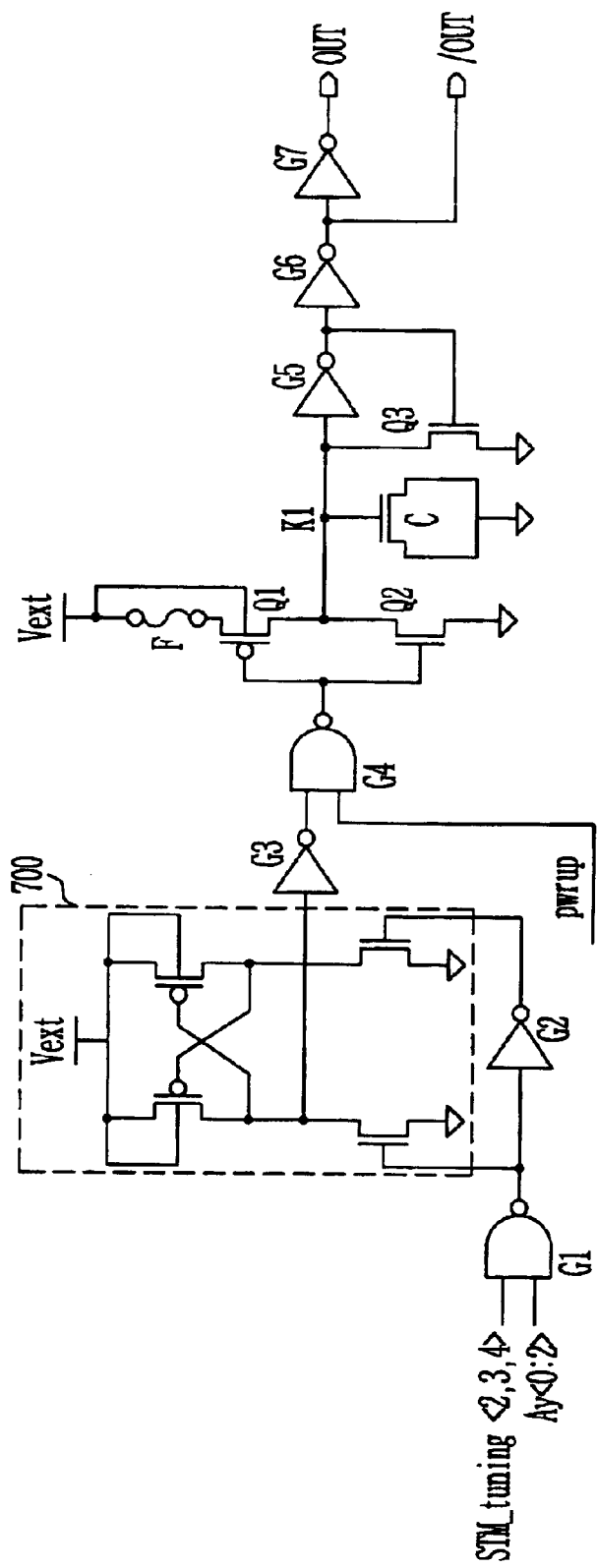

FIG. 8 is a circuit diagram illustrating each of the first to third time setting units 300 to 500.

The special test signals STM_tuning <2, 3, 4> and column addresses Ay<0:2> are combined by a NAND gate GI. An output of the NAND gate G1 is shifted by a level shifter 700. An output of the level shifter 700 is inverted by an inverter G3. An output of the inverter G3 is inverted by a NAND gate G4 according to a power-up signal pwrup. Pull-up and pull-down transistors Q1, Q2 are alternatively turned on in response to an output of the NAND gate G4 and then a potential of a node K1 is determined. When the pull-down transistor Q2 is turned on, the node K1 becomes low state. Contrarily, when the pull-up transistor Q1 is turned on, the node K1 becomes high state. A capacitor C is connected between the node K1 and a ground to maintain a potential of the node K1 for a predetermined time. The potential of the node K1 is inverted by an inverter G5 and then outputted to an output terminal OUT through inverters G6, G7. An output of the inverter G6 is connected to an output terminal /OUT. The inverter G5 and a transistor Q3 are operated as a latch in a period that the output of the inverter G5 is high. The output terminals OUT, /OUT have opposite levels for each other.

On the other hand, a fuse F connected between a power source and the pull-up transistor Q1 is possible for trimming. When the fuse F is trimmed, the output terminals OUT, /OUT are fixed. That is, as analyzing the address access time tAA by each step according to the special test mode signal and then trimming the fuse F, the address access time tAA is analyzed after the special test mode.

As described earlier, according to the present invention, it is advantageous to analyze device characteristics by easily varying the address access time and to test the address access time by each step according to the special test mode signal. Furthermore, it is advantageous to test the address access time after the special test mode.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A semiconductor memory device having an address access time control circuit, comprising:

a control path for enabling a sense generator signal for delaying time as long as a bitline sense amplifier operates in response to a row active signal and enabling a precharge signal according to the sense generator signal, wherein the control path includes:

a first time control unit for varying an enabling time of the sense generator signal by each step, according to a special test mode signal for testing the semiconductor memory device and a predetermined column address; and a second time control unit for varying an enabling time of the precharge signal by each step, according to a special test mode signal for testing the semiconductor memory device and a predetermined column address.

2. The semiconductor memory device having the address access time control circuit of claim 1, wherein the first time control unit includes:

a first time setting unit for generating a logic signal in response to a first column address, a first special test mode signal, and a power-up signal;

a second time setting unit for generating a logic signal in response to a second column address, a second special test mode signal, and the power-up signal;

a third time setting unit for generating a logic signal in response to a third column address, a third special test mode signal, and the power-up signal; and a decoding circuit for decoding outputs of the first, second, and third time setting units.

3. The semiconductor memory device having the address access time control circuit of claim 2, wherein the first, second, and third time setting units, respectively, include:

a first NAND gate for combining a column address and a special test mode signal;

a level shifter for shifting a level of an output of the first NAND gate;

a second NAND gate for transferring an output of the level shifter according to the power-up signal;

a pull-up transistor for pulling up a first node to high level according to an output of the second NAND gate;

a pull-down transistor for pulling down the first node to low level according to the output of the second NAND gate; and a driving unit for outputting an output of the first node with a delay.

4. The semiconductor memory device having the address access time control circuit of claim 1, wherein the second time control unit includes:

a first time setting unit for generating a logic signal in response to a fourth column address, a first special test mode signal, and a power-up signal;

a second time setting unit for generating a logic signal in response to a fifth column address, a second special test mode signal, and the power-up signal;

a third time setting unit for generating a logic signal in response to a sixth column address, a third special test mode signal, and the power-up signal; and a decoding circuit for decoding outputs of the first, second, and third time setting units.

5. The semiconductor memory device having the address access time control circuit of claim 4, wherein the first, second, and third time setting units, respectively, include:

a first NAND gate for combining a column address and a special test mode signal;

a level shifter for shifting a level of an output of the first NAND gate;

a second NAND gate for transferring an output of the level shifter according to the power-up signal;

a pull-up transistor for pulling up a first node to high level according to an output of the second NAND gate;

a pull-down transistor for pulling down the first node to low level according to the output of the second NAND gate; and a driving unit for outputting an output of the first node with a delay.

6. The semiconductor memory device having the address access time control circuit of claim 5, further comprising a fuse, connected between the pull-up transistor and a power source, capable of trimming.

7. The semiconductor memory device having the address access time control circuit of claim 3, further comprising a fuse, connected between the pull-up transistor and a power source, capable of trimming.

* * * * *